United States Patent [19]
Davis

[11] 4,196,839
[45] Apr. 8, 1980

[54] METHODS OF FABRICATING PRINTED CIRCUIT BOARDS

[75] Inventor: James J. Davis, New Cumberland, Pa.

[73] Assignee: International Telephone and Telegraph Corporation, New York, N.Y.

[21] Appl. No.: 920,608

[22] Filed: Jun. 29, 1978

[51] Int. Cl.² ............................................. B23K 1/08
[52] U.S. Cl. ................................ 228/180 R; 228/223; 228/23; 228/35
[58] Field of Search .................. 228/180 R, 223, 260, 228/19, 23, 35

[56] References Cited

U.S. PATENT DOCUMENTS

| | | | |
|---|---|---|---|
| 3,122,117 | 2/1964 | Marzullo et al. | 228/260 |
| 3,135,630 | 6/1964 | Bielinski et al. | 228/35 |
| 3,407,984 | 10/1968 | Walker | 228/180 |
| 3,439,854 | 4/1969 | Walker | 228/180 |
| 3,588,998 | 6/1971 | Corsaro | 228/260 |
| 3,723,191 | 3/1973 | Bos et al. | 228/260 |
| 3,874,068 | 4/1975 | Cook | 228/180 |
| 4,009,816 | 3/1977 | Feuchtbaum et al. | 228/180 |

*Primary Examiner*—Daniel C. Crane
*Attorney, Agent, or Firm*—John T. O'Halloran; Alfred C. Hill

[57] ABSTRACT

A printed circuit board is fabricated by a series of steps which eliminate the necessity of post soldering cleaning of the printed circuit assembly. The board is fabricated by positioning components on the top surface and uniformly applying a hydrophobic flux to the conductor surface of the board. The board is then passed through the crest of a wave of solder at a controlled temperature and for a controlled time. The solder wave is a single wave with a bidirectional flow. The application of the hydrophobic flux according to the methods and the subsequent wave soldering of the board enables removal of the board directly from the solder flow, and storage of the board for future use.

8 Claims, 2 Drawing Figures

METHODS OF FABRICATING PRINTED CIRCUIT BOARDS

BACKGROUND OF THE INVENTION

This invention relates to soldering methods and more particularly to a method of soldering printed circuit boards while eliminating the step of post cleaning.

As is well known, soldering is a method of attaching one metallic material to another. it has been used in the electronics industry for some time.

In regard to the fabrication of printed circuits, soldering is accomplished by a process sometimes referred to as dip soldering. Dip soldering consists of applying a flux, usually a rosin-alcohol mixture to the circuit pattern and then placing the board in contact with the molten solder. Slight agitation of the board assures good fillets around the wire leads.

In present techniques, the circuit board with its components assembled on one side of the board, has the conductor pattern pass through the crest of a wave of molten solder. In this technique referred to as wave soldering, all junctions are soldered as the board progresses through the wave. The flux, board temperatutre, solder temperature, and immersion time are interrelated and are adjusted for best results. Essentially, long exposure to hot solder is detrimental to the insulating material and to the adhesive that joins the copper foils to the insulation.

After solder dipping, the residual flux should be removed by a suitable solvent. One has to be sure that the solvent is compatible with the materials used in the components parts mounted on the board. Certain solvents frequently dissolve cements or plastics and marking inks and can further cause severe stress cracking of plastics.

Examples of soldering techniques and considerations can be had by reference to a book entitled "Printed Circuit Boards for Microelectronics" by J. A. Scarlett, published by Van Nostrand Reinhold Co., New York (1970).

As above indicated, the problems of cleaning printed circuit assemblies after wave soldering are considerable. For example, certain electronic components are extremely sensitive to the effects of chloro or fluoro hydrocarbons which are used as solvents. In regard to such uses, some of the reactions are immediately apparent, while others take a long time to provide an adverse reaction. It is thus apparent that the cleaning of circuit boards after wave soldering by the use of solvents creates extreme problems. A further difficulty is that the solvents employed such as hydrocarbons present health hazards to the user, as they are environmental pollutants.

it is further noted that post cleaning of printed circuit boards requires additional manufacturing time as well as additional materials. Hence, as can be ascertained, it would be extremely desirable to perform wave soldering of printed circuit boards without the necessity of post cleaning the boards with a solvent. To achieve such an operation, one would experience an overall cost reduction attendant with the following advantages:

(1) Elimination of solvents resulting in the elimination of a health hazard and a manufacturing component;

(2) Elimination of the manufacturing process time in a soldering operation by omission of the post cleaning step;

(3) Elimination of an additional operation of hand soldering components which are susceptible to solvent damage;

(4) Elimination of delayed damage to components not discovered until after prolonged operation of the circuit board;

(5) Elimination of wash-off of certain paint and ink markings on components;

(6) Permitting less restrictive material parameters for component construction which allows a wider selection of components for printed circuit boards and hence more economical procurement.

The advantages of the method to be described are as indicated above, while further enhancing the final product by the provision of an encapsulant type coating. The coating may serve to enhance the insulation value of the substrate surface between components and between traces and hence, provide a possible improvement in resistance of the assembly against normal or mildly pollutant atmospheres.

It will thus be shown that with the proper selection of processing materials and applied techniques, printed circuit assemblies are manufactured without recourse to post soldering cleaning.

BRIEF DESCRIPTION OF THE PREFERRED EMBODIMENT

A method of fabricating a printed circuit board comprising the steps of positioning components on a first top surface of said board in suitable conductor holes located in said board, applying a hydrophobic flux to a conductor surface of said board without flooding said components as positioned, brushing said conductor surface to remove any excessive flux coating, preheating said board so that the temperature of said top surface does not exceed about 160° F., passing said conductor surface of said board through a flow wave of solder with a bidirectional flow and for a time not exceeding relatively five seconds with said speed of solder flux and said board speed being relatively equal, removing said board from said solder flow for future use.

DETAILED DESCRIPTION OF THE FIGURES

Figure 1:
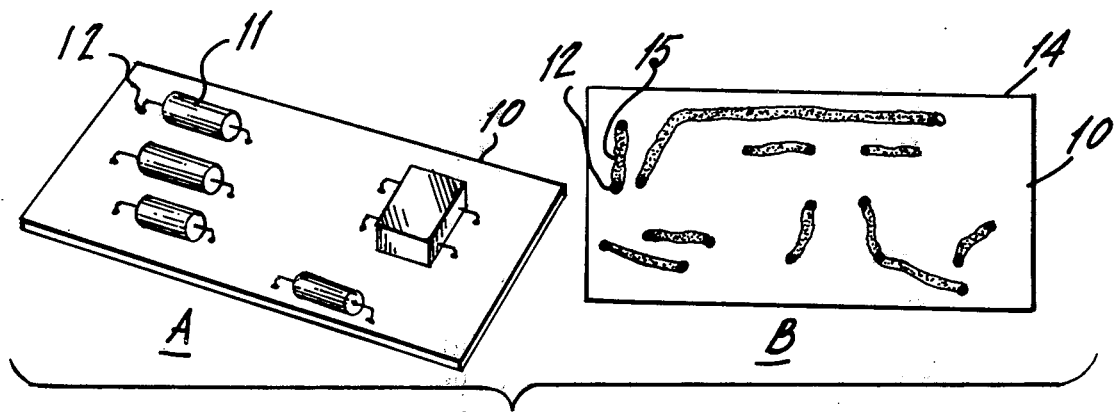
FIG. 1 consists of 1(A) which is a perspective view or a printed circuit board and FIG. 1(B) which is a bottom plan view of a printed circuit board showing a conductor pattern.

Referring to FIG. 1, there is shown a perspective view (A) of a printed circuit board. As is well known, a printed circuit is a conductive circuit pattern which is applied to one or both sides of an insulating substrate. The fabrication and use of printed circuit boards are well known and many texts such as the one indicated above describe various processes and techniques for fabricating and assembling such boards.

In order to gain a clear understanding of the invention, the printed circuit board consists of a substrate 10 which is a relatively rigid insulating base material and may vary in thickness from 1/64 to ½ inch. A common substrate material is NEMA-XXXP paper base phenolic. It is, of course, known that many other substrate materials can be employed for other applications. As shown in FIG. 1(A), components as 11 are placed on the board with their leads positioned in suitable holes as 12. FIG. 1(B) shows the bottom surface 14 of the board 10. Essentially, the bottom surface consists of a printed wiring wherein a conductor material as copper is directed between component terminals such as 12 to form a wiring pattern 15. Manufacturing processes for such boards employ etching, plating and other techniques for forming the conductive pattern and such techniques are well known in the art.

The printed circuit board 10 is conventionally finished to improve the storage shelf life of the circuit board and to facilitate soldering of the board in circuit. Some of the most widely used finishes are hot solder coating, silver plating, hot rolled or plated solder coat, as well as other finishes. One of the most economical and widely used finishing techniques is hot solder coating which is a dip solder technique where the board is passed through a bath of solder to finsih the cooper conductor pattern. As indicated above, wave soldering is a form of dip soldering where the board is passed through the crest of a wave of solder. Essentially, wave soldering is a well known technique and has been used for many years in the fabrication of printed circuit boards.

Before further proceeding with a description of the invention, it is indicated that in order to apply solder to a printed circuit board, a flux is used. Basically, fluxes are materials that remove contamination from the surface of a material to be soldered so that wetting can occur. A flux breaks up and removes tarnish layers on copper surfaces either by chemical combination or by chemical reduction. The flux also has to protect the surface of the metal during the soldering action.

It is a basic principle and widely acknowledged by the prior art that although most fluxes are relatively non-reactive after soldering, it is considered good and recommended practice to carefully remove any flux remnants after soldering. Hence, the prior art cleans the printed circuit board after wave soldering by the use of solvents as indicated above. This is done to rid the assembly of those constitutents in flux that eventually lead to corrosion, reduced resistance, and leakage between traces or lead wires. Basically, flux residues cause circuit board degradation.

It is therefore the intent of this invention to describe a method fabricating a printed circuit board without the necessity of performing a post solder cleaning operation. This technique therefore provides all the advantages above described, while further eliminating substantial time and efforts in the fabrication of such boards.

Figure 2:
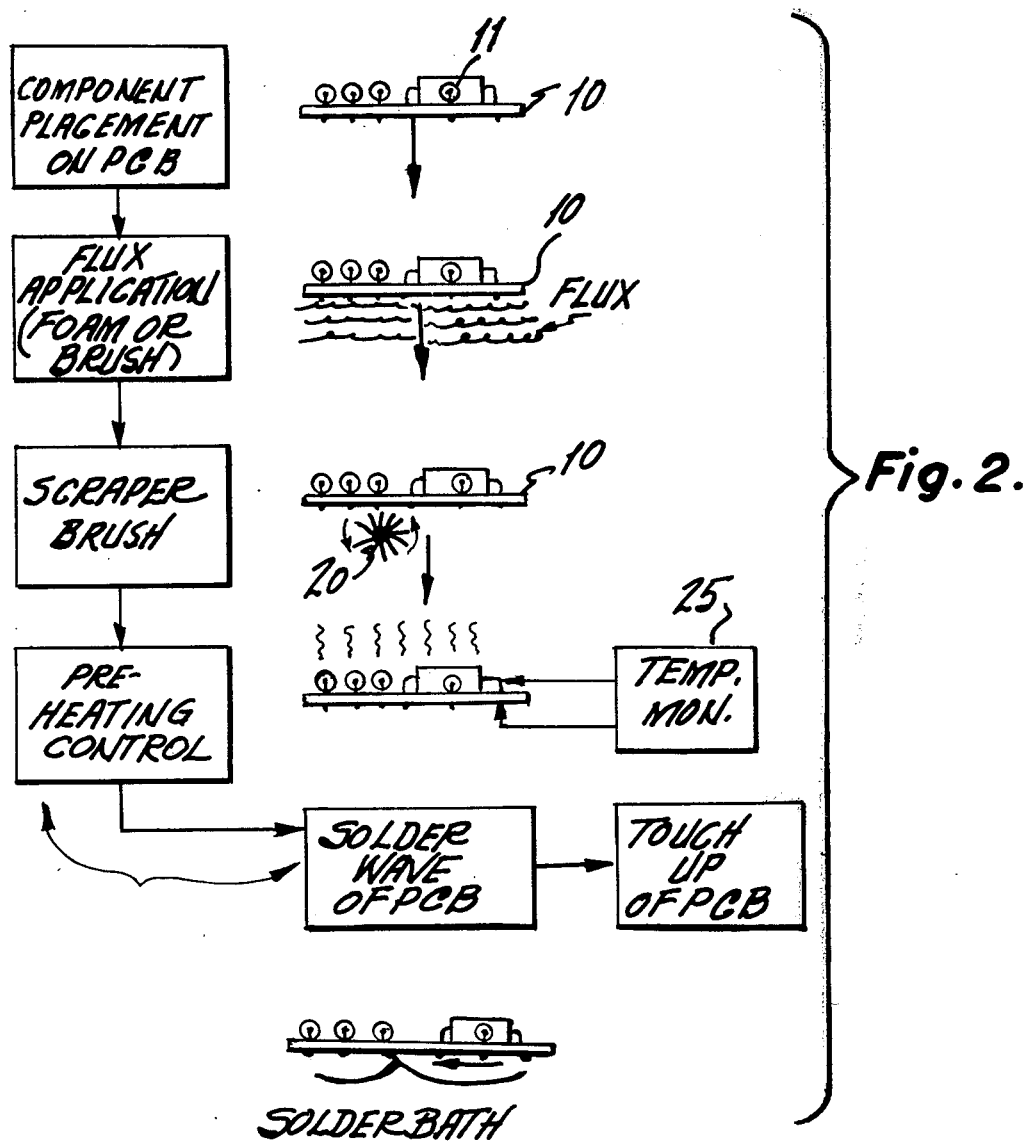
FIG. 2 is a block diagram depicting a series of steps to be performed according to the methods of this invention.

Referring to FIG. 2, there is shown a flow type diagram depicting the methods employed in the fabrication of a printed circuit board according to this invention.

The first step in the fabrication of the printed circuit board is the formation of the component holes and the subsequent formation of the wiring pattern. As shown in FIG. 2, the printed circuit board 10 has positioned thereon, electrical components such as 11 in the suitable lead holes.

Essentially, certain components are susceptible to flux penetration and hence, these components are spaced above the top surface of the board a minimum of 0.02 to a maximum of 0.047 inches. The purpose of spacing these components is to minimize capillary action of flux and to avoid entrapment of resin. In particular, such components as switches and relays are particularly susceptible to be attacked by the flux and hence, such components should be positioned above the board as well as a strict control of flux application.

After the component placement as specified above, the printed circuit board 10 is now subjected to a controlled flux application. In regard to the flux used, it is important to note that the flux type is semicritical in this application and the flux employed should be hydrophobic, insulating in character, neutral and relatively non-corrosive. Ionic constituents of such a flux which are not removed in soldering are then largely encapsulated in the dried residue. A number of commercial fluxes are suitable for application to the printed circuit board during the flux application step.

An example of a suitable flux is manufactured by Alpha Metals as Flux No. 809-MM. This flux consists of about twenty-five percent solids and is essentially a low activiator flux. Other examples of suitable fluxes are supplied by the Kester Co. as Formula 1544. These fluxes comply with military standards as specified in Mil-S-6872A and basically, these fluxes are not soluble in water.

The flux as indicated, is applied in a controlled application and may be foam or brush applied to assure wetting of the full undersurface of the board without flooding of the top surface and without incursion of the flux through component mounting holes to the upper surface. This, in conjunction with the spacing of the components from the top surface of board 10 assures that the flux will not penetrate into the components.

After the application of the flux as indicated, the flux coated surface of the board is immediately treated with a scraper brush 20. The brush is lightly set to touch the board surface to remove any excessively heavy coating of the flux. Care is taken to assure that the brush does not exert any great forces on the board to cause flux to be forced up through the component mounting holes.

The board as now fluxed is then introduced into a wave soldering machine. Many machines capable of performing wave soldering are available on the market and a suitable machine is manufactured by the Dee Electric Co. The machine is set to assure preheating of the board to achieve a minimum of 150° F. and a maximum of 160° F. on the top surface of the board as measured by a thermocouple or suitable measuring device 25. The preheating control is necessary to assure that the flux solvents will evaporate, to aid in activation and to avoid the baking of resin contained in the flux.

Essentially, the speed of traverse of the wave soldering machine is set to produce about 150° F. on the top surface of the board and approximately three to three and one-half seconds of intimate contact with the solder wave. The solder wave of the machine is adjusted to have immersion of the board equal to a minimum of one-third to a maximum of one-half of the board thickness immersed in the solder wave.

The soldering machine is set to single wave operation with a bidirectional flow. The bidirectional flow aids in scrubbing the flux residue from the board, while producing a good "surround" on joints and fillets. The time speed of traverse to assure intimate contact with the molten solder is about 3.5 seconds nominal and 5 seconds maximum. The speed of the solder flow and the speed of the board through the wave soldering machine was made to be approximately equal at separation with any deviation to be in the faster solder flow.

The board, after the above described period of contact with the soldering wave, is now removed and stored for future use. There is no necessity of performing post cleaning of the board if the above described steps are implemented. If an inspection of the board reveals that touchup of soldered surfaces is necessary, this can be done with a 63/37 alloy wire solder without flux.

Many printed circuit boards were fabricated according to the above described process and examined and tested. It was found that the surfaces of the treated boards appeared to wet satisfactorily and there was a limited vertical creep on component leads. Creep was a maximum of 1/16 of an inch above the board surface on test specimens. There was no spattering during fluxing, nor was there much sputtering through the solder waves. The characteristic of the soldering deposit was uniformly good. The conductor lead or traces were well covered and the joints were uniform and full. Icicling was essentially non-existent and there was a total absence of spider webbing.

Most of the boards possessed a surface which appears bare and dry and exactly as if it had been post solder cleaned. Certain boards exhibited a residue which was visually detectable but did not consist of a heavy film or heavy accumulation. Essentially, the residue was approximately 7.2 micrograms per square centimeter of board area. In spite of any residue, the boards did not exhibit signs of corrosion or salt formation and exhibited no evidence of deterioration.

It is further noted that technique enhances substrate characteristics by an improvement in surface resistivity, the advantage of insulating values between circuit tracks and the improvement of anticorrosive properties.

Based on such observations and experiences, it appears possible that the technique provides an encapsulant type coating for any residue which would enhance the insulation value between component surfaces and between traces. This could improve resistance against effects of normal or mildly polluted atmospheres.

As indicated above, an important aspect of the techniques set forth is obtaining a printed circuit board being relatively free of ionic residue without employing the additional step of post cleaning after wave soldering. In order to determine the effects achieved, an important part of the technique is a process for monitoring the quality of the boards in regard to the amount of ionic residue remaining. Essentially, excessively high readings will show the process is out of control, while below nominal readings show better results than the maximum allowable quantity of reactive residues permitted.

In performing such tests, an instrument called an Ionograph was employed. Many such instruments are available and one is manufactured by Alpha Metals of Jersey City, N.J. As indicated, there are other instruments which are capable of performing similar quantative analysis.

The mode of measuring is to measure the transconductance of a liquid medium as a device or part of a device is immersed in the medium. The magnitude and duration of the reading obtained when correlated to the area of the device as immersed in the liquid produces a very precise readout of free ionic residue in micro grams per square centimeter. This is an accurate and effective means of determining the amount of ionic residue and therefore is completely checking the effectiveness of the process.

In order to use the Ionograph, one is required to depart from conventional procedure. Most manufacturers recommend that the liquid used is a fifty-fifty water-alcohol mixture. It has been determined that alcohol produces misleading results. The reason for this is that alcohol attacks and dissolves materials used in the printed circuit board or in the components employed on the board and for example, alcohol effects the solder resist mask, wax impregnants and some plastics. One can therefore experience relatively high readings on assemblies that have not been through the soldering process. Because alcohol dissolves resin, the activators in the flux are freed from the encapsulation as above described and that is a fundamental property of the stipulated flux type employed in this technique. Hence, by employing the above described liquid mixture as recommended by the manufacturer, one would obtain readings that are high and have little validity in regard to the above described process.

Hence, in order to obtain readings concerning ionic residues that will react with normal atmospheres or be effected by normal atmospheric humidity, one has to modify the tests as will be explained. Basically, ionic residues that are entrapped and encapsulated as described in the process are not available to the atmosphere and only free residues are available for chemical reaction. Hence, in order to ascertain the effectiveness of the techniques employed in the process, one is required to measure for the presence of free residues. Therefore, the liquid employed in the Ionograph is neutral, de-ionized water. In this manner, one measures only those ions that are available and one does not dissolve out encapsulated materials or component construction parts. Hence, by employing a neutral water, neither acid or alkaline, one obtains a more proper solvent medium for use in the Ionograph. The pulsating water flow performs a flushing action on the test specimen which is operative to wash out water soluble or hygroscopic materials, except where such compounds are encapsulated by the flux resin, which as indicated is a non-water soluble type. The water will also remove compounds susceptible to the flushing or mechanical scrubbing action of the pulsating stream flow. Hence, in employing the Ionograph with a neutral water as a liquid eliminates the deleterious effects of alcohol in attacking and leaching elements from the components and the boards themselves.

Multiple testing of such boards as fabricated according to the above described process were made and representative samples were placed in the Inonograph for an initial reading. These samples were then placed in an environmental chamber for prolonged periods up to two weeks, while others were placed on racks and exposed to the atmosphere. The environmental chamber was run in a slightly modified form of Mil standard 202, method 106 in which the humidity is limited to ninety-five percent to prevent condensation. The samples placed on the racks were used as a reference control for comparison with the chamber exposed specimens. These pieces were then scrutinized by a visual review to determine the formation of any corrosion or salt formation or any visual changes in the characteristics of the flux residue.

Examination of the boards was made under a twenty-three time magnification with surface illumination of the specimens. The boards exposed to the atmosphere and other boards as contained in an environmental chamber for periods up to fourteen days showed no visible changes or deficiencies when tested. Thus, the tests performed on the processed boards after exposure of the same indicated that the technique as described was extremely effective in producing a high quality product and one could eliminate the above described problems by following the techniques described herein.

In summation, it has been determined that one can completely avoid post cleaning and the use of obnoxious solvents as improper cleaning is worse than no cleaning at all. If one follows the above described method, one can achieve the advantages of the elimination of solvents, the elimination of processing time in manufacturing, the elimination of a second operation of soldering solvent susceptible components, the elimination of delayed damage to components not discovered until prolonged use, the elimination of washoff of certain paint and ink markings and in general, the ability to select less restrictive parameters for component construction to thereby provide an overall more economical and reliable printed circuit. These and other advantages of the methods described will be apparent to those skilled in the art and are deemed to be concompassed within the scope of the claims appended hereto.

I claim:

1. A method of wave soldering a printed circuit board which eliminates post-soldering cleaning consisting of the steps of:

mounting components adjacent a first surface of said board such that terminal leads of said components project through mounting holes in said board from said first surface to a second conductor carrying surface of said board and such that at least flux susceptible ones of said components are spaced a predetermined distance from said first surface, applying in a controlled manner a hydrophobic, insulating, neutral, non-corrosive flux to said second surface without flooding said first surface and said components and without massive incursion through said mounting holes to said first surface, said predetermined distance and said controlled application of said flux minimizing capillary action of said flux along said terminal leads through said mounting holes to at least said flux susceptible ones of said components and avoiding entrapment of solids of said flux on said first surface, brushing said second surface lightly to remove any excessive flux coating without forcing said flux through said mounting holes, preheating said board so that the temperature of said first surface does not exceed about 160° Fahrenheit to evaporate the solvent of said flux, to aid in activation of said flux and to avoid baking of said solids of said flux, passing said second surface of said board through a flow wave of molten solder with a bidirectional flow for a given period of time not exceeding five seconds with the speed of said wave of solder and said board being relatively equal, said bidirectional flow of said wave of solder aiding in scrubbing flux residue from said second surface and producing good "surrounds" on joints and fillets, and removing said board from said solder flow for future commercial use free of said flux residue which normally would lead to long term degradation of said soldered printed circuit board.

2. The method according to claim 1 wherein said predetermined distance is between 0.020 to 0.047 inches.

3. The method according to claim 1 wherein said flux is applied by a foam bubble application.

4. The method according to claim 1 wherein said flux is applied by a brush application.

5. The method according to claim 1 wherein said preheating is accomplished between a temperature range of 150 to 160 degrees F.

6. The method according to claim 1 wherein said second surface of said board when passed through said solder solder wave causes said board to be immersed in said wave between one-third to one-half of the thickness of said board.

7. The method according to claim 1 wherein said given period of time is between 3.0 to 5.0 seconds, with a nominal time of 3.5 seconds.

8. The method according to claim 1 wherein any flux residue remaining on said soldered printed circuit board after said passing step is encapsulated to prevent degrading effects on said soldered printed circuit board.

* * * * *